(12) United States Patent
Wong et al.

(10) Patent No.: US 7,010,774 B1
(45) Date of Patent: Mar. 7, 2006

(54) BOTTOM-UP APPROACH FOR SYNTHESIS OF REGISTER TRANSFER LEVEL (RTL) BASED DESIGN

(75) Inventors: Jacques Wong, Santa Clara, CA (US); Beng Chew Khou, Singapore (SG); Boon Piaw Tan, Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 515 days.

(21) Appl. No.: 09/517,518

(22) Filed: Mar. 2, 2000

Related U.S. Application Data

(60) Provisional application No. 60/173,489, filed on Dec. 29, 1999.

(51) Int. Cl.
*G06F 17/50* (2006.01)

(52) U.S. Cl. .......................... 716/18; 76/2; 76/3; 76/4; 76/5

(58) Field of Classification Search ................. 716/18, 716/2, 3, 5, 4
See application file for complete search history.

(56) References Cited

U.S. PATENT DOCUMENTS

| | | | |
|---|---|---|---|
| 5,541,849 A | | 7/1996 | Rostoker et al. |
| 5,546,320 A | | 8/1996 | Biro et al. |
| 5,812,416 A | | 9/1998 | Gupte et al. |
| 5,907,698 A | | 5/1999 | Kucukcakar et al. |
| 5,933,356 A | * | 8/1999 | Rostoker et al. ............... 703/15 |
| 5,956,257 A | * | 9/1999 | Ginetti et al. .................... 716/3 |
| 5,963,730 A | | 10/1999 | Toyonaga et al. |
| 6,289,498 B1 | * | 9/2001 | Dupenloup ................... 716/18 |
| 6,292,931 B1 | * | 9/2001 | Dupenloup ................... 716/18 |
| 6,295,636 B1 | * | 9/2001 | Dupenloup ................... 716/18 |

OTHER PUBLICATIONS

David R. Smith, Hardware Synthesis from Encapsulated Verilog Modules, Application Specific Systems, Architectures and Processors. ASAP 96. Proceedings of International Conference on.*

M. C. McFarland, Using Bottom-Up Design Techniques in the Synthesis of Digital Hardware from Abstract Behaviorial Descriptions, 23rd Design Automation Conference, pp. 474-480, Jul. 1986.*

* cited by examiner

*Primary Examiner*—A. M. Thompson

(57) ABSTRACT

A method for synthesizing a register transfer level (RTL) based design employs a bottom-up approach to generate a final top-level design. The top-level design is divided into a plurality of sub-modules. Each of the sub-modules is then independently synthesized using an RTL based design approach and independently adapted to conform to timing requirements produced for each of the sub-modules using time budgets that are based on the top-level timing requirements. Once the sub-modules are synthesized and pass individual timing requirements specific for those sub-modules, the sub-modules are integrated to form a top-level design. The top-level design may then be verified for timing requirements and other formal requirements.

10 Claims, 3 Drawing Sheets

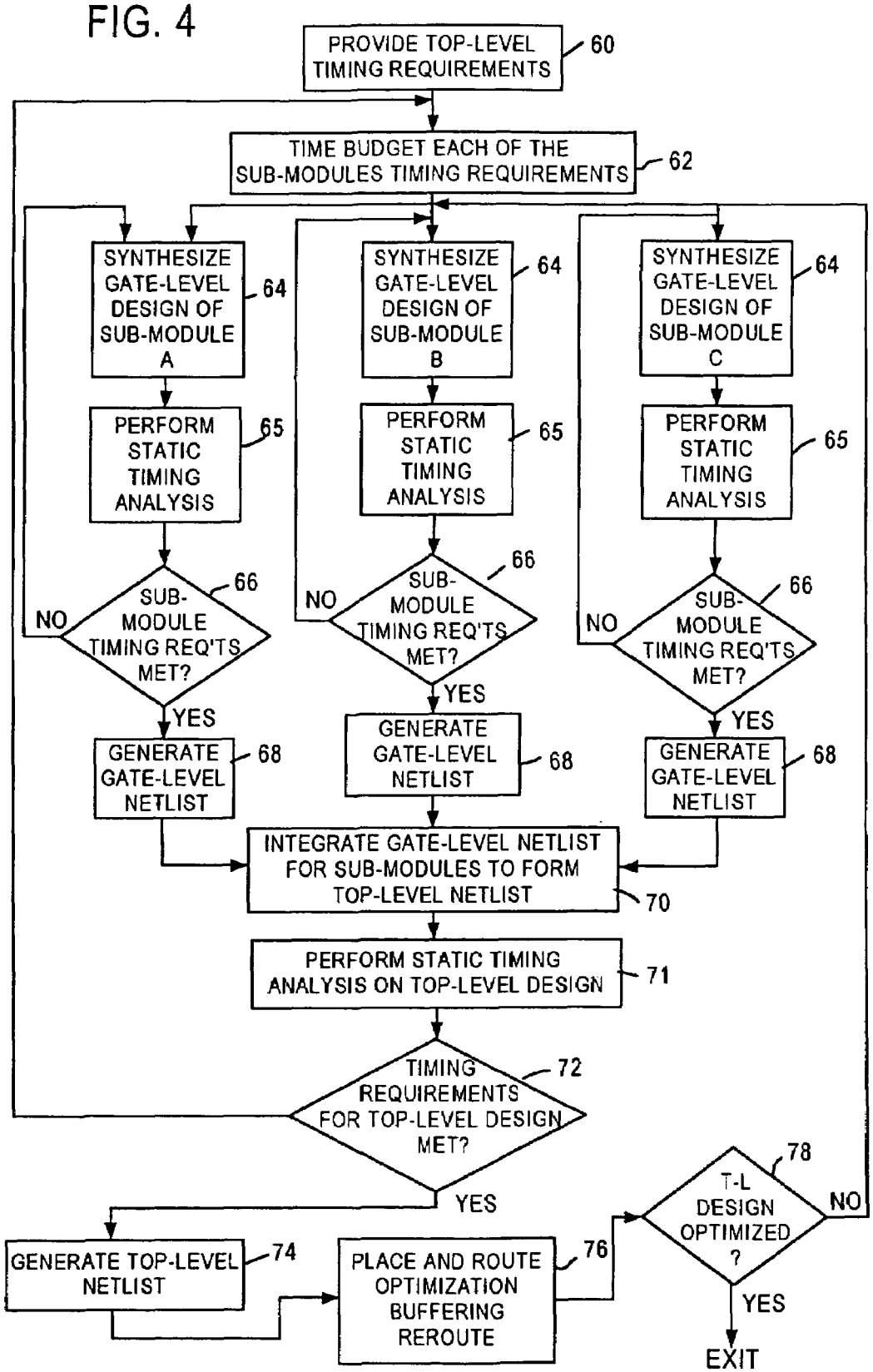

BOTTOM-UP APPROACH FOR SYNTHESIS OF REGISTER TRANSFER LEVEL (RTL) BASED DESIGN

RELATED APPLICATIONS

This application contains subject matter related to the subject matter disclosed in copending U.S. Provisional Patent Application Ser. No. 60/173,489, filed on Dec. 29, 1999.

FIELD OF THE INVENTION

The present invention relates to the field of integrated circuit design, and more particularly, to the synthesis of register transfer level (RTL) based design.

BACKGROUND OF THE INVENTION

The synthesis of register transfer level (RTL) based design is a process of translating hardware descriptive language (HDL) coded design to required technology logic gates based on library technology provided and given timing constraints. In order for a design to be synthesized to the required technology logic gates, timing constraints are normally imposed from the top level onto the input and output pins. Based on the timing constraints of the input and output pins, the logic gates are inferred based on the HDL-coded design to meet these timing constraints. This achieves the required speed of operation and logic functionality using the logic gate library technology provided.

However, current designs are increasingly complex and larger, and incorporate more functionality into a smaller piece of silicon. The approach of synthesizing designs using top-level synthesis by imposing the timing constraints of input and output pins creates a bottleneck in achieving a fast turn-around time for achieving a required speed of operation and logic functionality to satisfy the demanding fast time-to-market environment of integrated circuit innovations.

SUMMARY OF THE INVENTION

There is a need for a method for synthesizing RTL based design that achieves a quick turn- around time and design of an integrated circuit in order to meet fast time-to-market environment of integrated circuit innovations.

This and other needs are satisfied by the present invention which provides a method of synthesizing a register transfer level (RTL) based design of a system. The method comprises the steps of determining sub-modules of a top-level system and determining individual time budgets for each sub-module based on timing requirements of the top-level system. Gate level designs of the sub-modules are synthesized based on the determined time budgets for the individual sub-modules. The gate level designs of the individual sub-modules are integrated to form a top-level design. The top-level design is tested for conformance with top-level design requirements. A top-level netlist is generated when the top-level design conforms to the top-level designer requirements.

By performing this "bottom-up" approach towards synthesizing the RTL based design, the gate level design of sub-modules can be synthesized independently as a stand-alone design more efficiently and achieve a better area optimization while at the same time meeting the logic functionality and speed of operation requirements of the whole design. Also, the breaking up of the large and complex top-level design into a few logical sub-modules or sub-blocks permits the achievement of a quick turn-around time for design to meet the fast time-to-market requirements of integrated circuit innovations.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 4 is a flow chart of a method for a bottom-up synthesis of RTL design of an integrated circuit in accordance with embodiments of the present invention.

DETAILED DESCRIPTION OF THE INVENTION

The present invention addresses and solves problems associated with the synthesis of RTL based design from a top-level design while meeting the timing constraints in a fast and efficient manner. This is achieved in the present invention through a bottom-up approach toward the synthesis of the RTL based design. In such an approach, a large and complex design is divided into a plurality of logical sub-modules of block designs. These logic The gate level design of these sub-modules are synthesized independently as stand-alone designs in a more efficient manner. A better area of optimization is achieved, while meeting the logical functionality and speed of operation requirements of the whole design.

Figure 1:
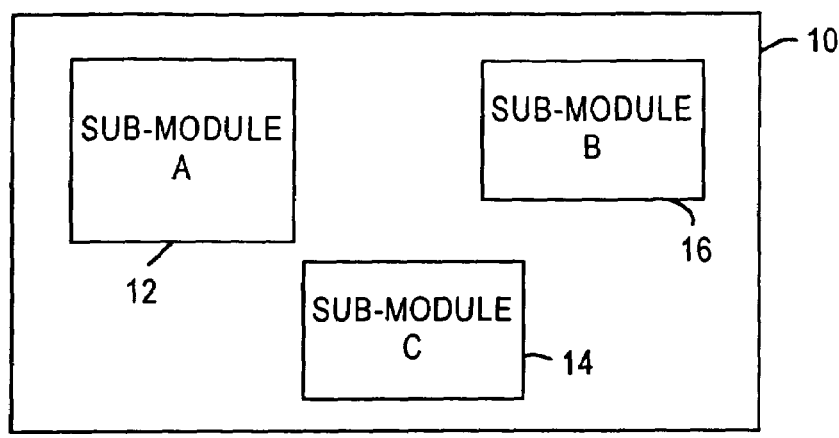
FIG. 1 is a block diagram of a top-level system and sub-modules of the system.

FIG. 1 is a block diagram of an exemplary embodiment of an integrated circuit layout. The entire layout is indicated by reference numeral 10, representing the top-level design. The top-level design has certain timing requirements and other design constraints. For purposes of explanation in the following, the integrated circuit top-level design 10 is considered to be dividable into sub-modules A, B, C, referenced by numerals 12, 14 and 16 in FIG. 1. The sub-modules 12-16 represent different logic functions and have different operational timing requirements and time budgets.

Each of the sub-modules 12–16 will have different timing requirements defined for each sub-module's input and output signals. Also, each of the sub-modules 12–16 will have different wire loading and input/output signal loadings. In accordance with the process of the present invention, the bottom-up approach to synthesize the RTL based design of the integrated circuit 10 treats each of these sub-modules 12–16 independently in the synthesis, and then integrates the independently synthesized designs of the sub-modules 12–16.

Figure 2:
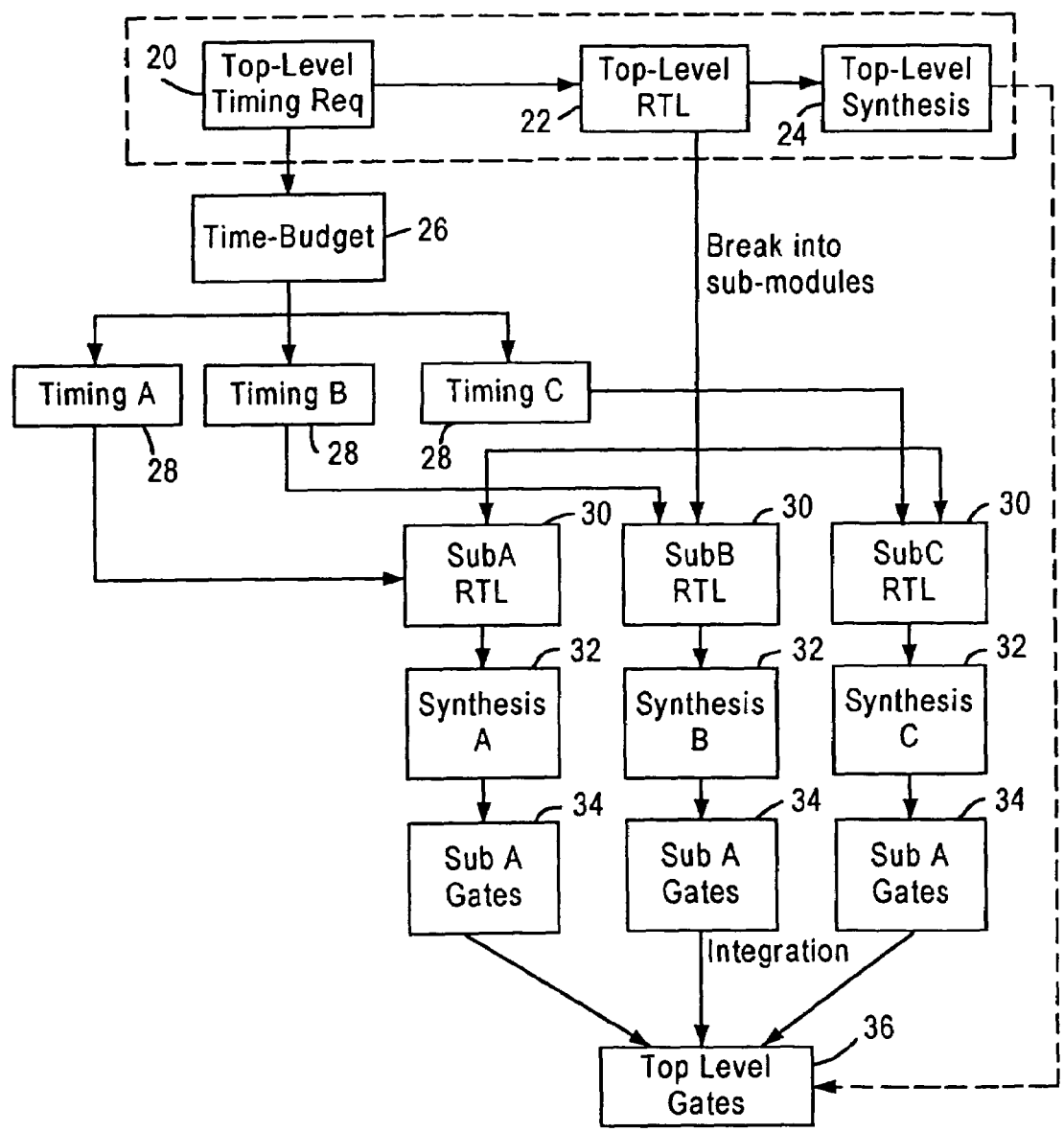
FIG. 2 is a block diagram that depicts the breakdown of a top-level synthesis to a sub-module synthesis for the bottom-up approach for synthesis of RTL based design in accordance with the embodiments of the present invention.

FIG. 2 is a block diagram depicting the breakdown of a top-level synthesis to a sub-module synthesis for the bottom-up approach of synthesis of RTL based design in accordance with embodiments of the present invention. In the present invention, the timing requirements of the top-level design are determined, in block 20. These timing requirements for the top-level design are used in the synthesis of the top-level RTL based design in block 22. In conventional approaches, the top-level RTL is then used to synthesize the top-level design of the integrated circuit. From the synthesis of the top-level design provided in block 24, a netlist of the top-level design is provided, as depicted in block 36. The dashed lines in FIG. 2 represent the prior art approach to the synthesis of an RTL based design using a top-level synthesis flow, instead of the bottom-up approach of the present invention.

As depicted in FIG. 2, the timing requirements of the top-level design are used in the present invention to form a time-budget for the system, as depicted by block 26. Time-budgeting is a process of defining all of the timing requirements of input and output signals of each sub-module design to achieve functional operability as well as speed of operation of the top-level design. Hence, the time-budget 26 process provides the timing for the different sub-modules A, B, C. This is depicted in the synthesis of FIG. 2 by blocks 28A, 28B and 28C. The timing requirements of sub-modules A, B, C, provided in blocks 28A, 28B and 28C, are used in the synthesis process of each of the individual sub-modules.

The top-level RTL is broken down into 3 logical RTL blocks, sub-module A RTL, sub-module B RTL and sub-module C RTL. These are represented by blocks 30A, 30B and 30C in FIG. 2. With the input of the timing requirements for the individual sub-module, and the sub-module RTL, broken down from the top-level RTL, a synthesis of each sub-module as a stand-alone design is performed as depicted in blocks 32A, 32B and 32C. The synthesis process of an individual sub-module will be described later with respect to FIG. 3. The synthesis of each sub-module design is performed independently, and generates a stand-alone design. Such a synthesis is performed in accordance with conventional RTL and synthesis techniques for the individual sub-module designs.

Each sub-module A, B, C undergoes an iterative process in order to meet the timing requirements of its input and output signals. Once a static timing analysis performed on each depicted in blocks 34A, 34B and 34C. The netlist is a list of components and connections for the sub-modules.

It is only after each of the sub-modules A, B, C have been designed and verified for conformance with the individual timing requirements for those sub-modules, based upon the time-budgeting process, that the designs for the individual sub-modules are integrated into a top-level design. This is depicted in block 36. The top-level design netlist that is generated, which includes all of the integrated sub-modules, undergoes a static timing analysis using the top-level timing requirements, block 20, to verify input and output speed of operations. Also during this process, the internal signal timing paths between all of the sub-modules are also checked to meet the timing requirements.

System-level verification test suites that are normally used to verify functionality of a top-level RTL-based design are used to verify the integrated top-level design that integrates the sub-module designs. The verification test suites check the logic functionality as well as the operational timing requirements of the integrated top-level design against the design functional and timing specifications.

Figure 3:
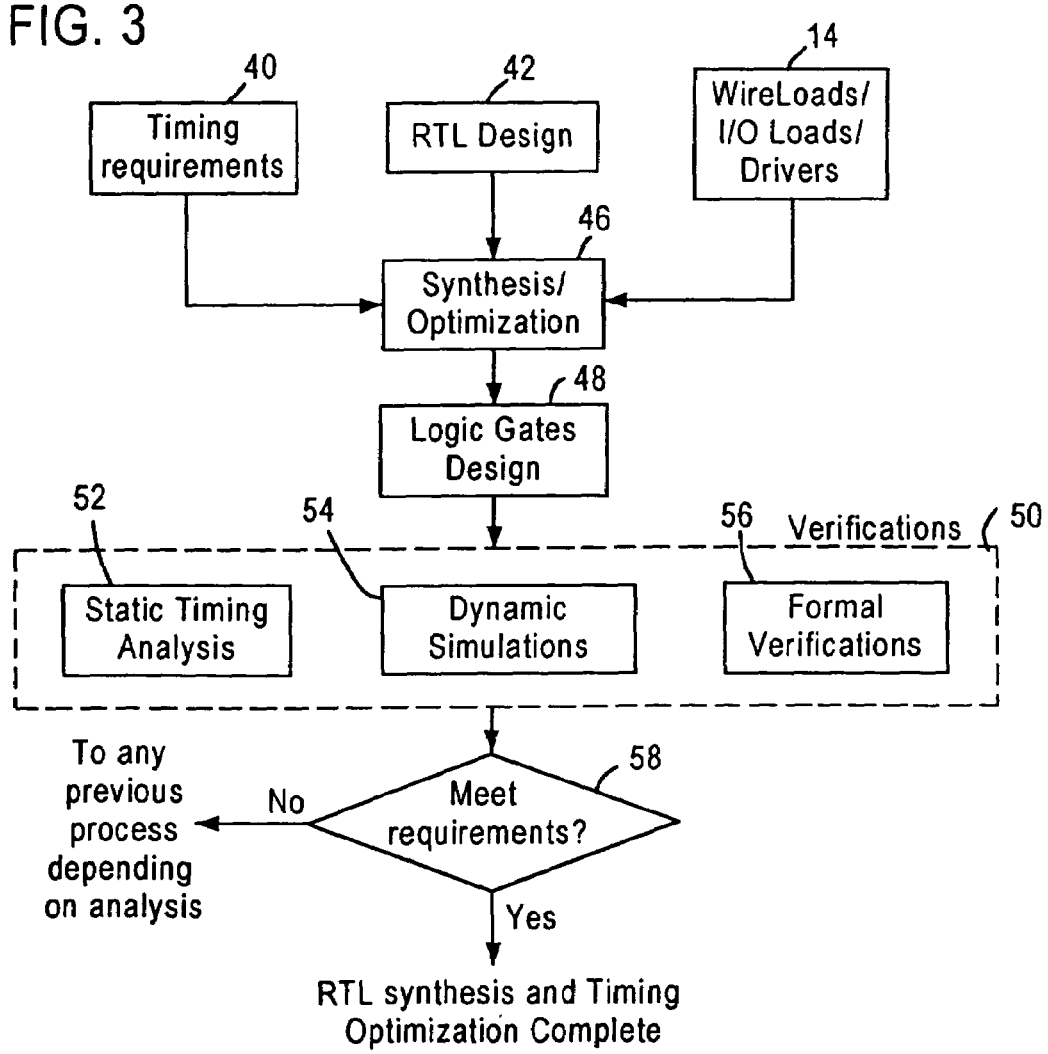
FIG. 3 is a block diagram flow of the synthesis of RTL based design for a sub-module in accordance with embodiments of the present invention.

FIG. 3 depicts a typical flow of the synthesis of a gate level design for a sub-module, as depicted by blocks 32A, 32B and 32C in FIG. 2. This synthesis may be used for top-level designs or for individual sub-module designs. The synthesis finds particular application in the present invention for synthesizing sub-modules, which are then integratable into a top-level design, rather than using the synthesis to directly synthesize the top-level design.

In the typical flow of synthesis of a gate level design for a sub-module, the synthesis/optimization process is represented by block 46 and receives as inputs the timing requirements of the design 40 for that sub-module, RTL design 42 for that sub-module, and the wire loading and I/O loading/drivers 44 for that sub-module. The synthesis/optimization process uses these inputs to generate the gate level design as depicted in blocks 46 and 48. Based upon the gate level design, verification is performed and is represented by block 50. The verifications include a static timing analysis 52, dynamic simulation of the circuitry 54, and other formal verifications typically used in RTL-based design. When the requirements are met, as depicted by decision block 58, the synthesis of gate level design of the sub-module is complete and ready for production of a netlist for that sub-module. Referring back to FIG. 2, the sub-module netlist for that sub-module may then be integrated with the other sub-module netlists to form a top-level netlist for the top-level design. If the requirements are not met, the process returns back to one of the previous process steps, depending on which requirements are not met. The process is iterated to optimize or re-synthesize to meet the timing requirements for that sub-module.

The time-budgeting is performed to define timing requirements for each of the sub-modules. The initial floor planning of the designs extracted an initial estimated wire load model and loading information to be imposed on the sub-module level synthesis. Based on these timing and design requirements, each of the sub-module designs undergoes the synthesis process.

When the verifications are passed, the top-level netlist is fed to a back-end process where the top-level netlist is placed and routed. When the place and route process is completed, more accurate extracted information is used in the synthesis of the gate level design of the sub-modules to provide final and more accurate optimizations. The synthesis of the gate level design of the sub-modules is repeated to achieve the final top-level design that meets all the timing requirements and functional specifications of the top-level design.

The procedures described above are summarized in the flow chart of FIG. 4 in which the top-level timing requirements are provided in step 60. The time-budget of each of the sub-modules determines the timing requirements for each of the sub-modules, as provided in step 62. Each of the sub-modules undergoes independent gate level synthesis in steps 64A–C. The gate level design synthesis for the sub-module is based on the timing requirements, wire load modules, and I/O signal loadings, for example. Verification of the performance of the gate level design of the sub-modules is performed in steps 65A–C. These include static timing analysis, dynamic simulations and other formal verifications. It is then determined in steps 66A–C, for each of the sub-modules, whether the timing requirements for the sub-modules are met. If they are not met, the synthesis process of gate level design for the individual sub-module or sub-modules is/are performed until the timing requirements are met and verifications passed.

Once an individual sub-module has passed the timing requirements and verifications, as determined in steps 66A–C, a netlist for that gate level design is provided in steps 68A–C, which are integrated in step 70 with the other netlists for the corresponding gate level designs of the other sub-modules to form an integrated top-level design netlist. The integrated top-level design netlist for the corresponding gate level designs of all the sub-modules is then tested in step 71 in the same manner as each of the individual sub-modules in steps 65A–C. It is determined in step 72 whether the integrated top-level netlist for the corresponding gate level designs of all the sub-modules satisfies all of the top-level designed timing requirements and other verifications performed on the top-level final design. If it does not, the process returns to step 62 or steps 64A–C to re-perform the synthesis of the gate level design for the sub-modules.

When the integrated top-level design netlist for the corresponding gate level designs of all the sub-modules passes the verification procedure, as determined in step 72, a top-level netlist is generated (step 74) and then placed and routed (step 76). Once the place and route process is completed, more accurate extracted information is used to impose on the sub-module synthesis to produce a final and more accurate optimization of the design. This is depicted by the determination in step 78 whether the optimization is finalized. If the optimization is considered to be a final optimization, the process is exited.

The bottom-up approach for synthesis of RTL-based design, using independent synthesis of sub-modules of a top-level design, provides fast and accurate design of a large and complex circuit, while satisfying overall timing and design requirements of the top-level design.

Although the present invention has been described and illustrated in detail, it is to be understood that the same is by way of illustration and example only and is not to be taken by way of limitation, the scope of the present invention being limited only by the terms of the appended claims.

What is claimed is:

1. A method of synthesizing a register transfer level (RTL) based design of a system comprising the steps of:
   determining a plurality of sub-modules of a top level system;
   determining individual time budgets for each sub-module based on timing requirements of the top-level system;
   synthesizing a gate-level design of said each sub-module based on the determined time budgets for said each sub-module;
   testing the gate-level design of said each sub-module for conformance with design requirements of said each sub-module;
   generating a netlist for said each sub-module when the gate level design of said each sub-module conforms to said design requirements of said each sub-module, then integrating the netlist of said each sub-module to form an integrated top level design netlist;
   testing the integrated top-level design netlist for conformance with top-level design requirements; and
   generating a top-level netlist when the integrated top-level design netlist conforms to the top-level design requirements.

2. A method of synthesizing a register transfer level (RTL) based design of a system comprising the steps of:
   determining a plurality of sub-modules of a top level system;
   determining individual time budgets for each sub-module based on timing requirements of the top-level system;
   synthesizing a gate level design of—said each sub-module based on the determined time budgets for said each sub-module;
   testing the gate level design of said each sub-module for conformance with design requirements of said each sub-module;
   generating a netlist for said each sub-module when the gate level design of said each sub-module conforms to said design requirements of said each sub-module, then integrating the netlist of said each sub-module to form an integrated top level design netlist;
   testing the integrated top-level design netlist for conformance with top-level design requirements; and
   generating a top-level netlist when the integrated top-level design netlist conforms to the top-level design requirements,
   wherein testing the gate level design of said each sub-module includes performing static timing analysis on said each sub-module for conformance with timing requirements for said each sub-module.

3. The method of claim 2, wherein the netlist is generated for said each sub-module only if the timing requirements for said gate level design of said each sub-module are met.

4. The method of claim 3, wherein the step of synthesizing is re-performed and the gate level design of said each sub-module is re-tested in an iterative manner to verify conformance of the gate level design with the timing requirements of said each sub- module.

5. The method of claim 4, wherein the step of synthesizing is further based on wire loads and input/output loads/drivers.

6. The method of claim 5, wherein the step of testing the gate level design of said each sub-module for conformance with design requirements of said each sub-module includes performing a dynamic simulation on the gate level design of said each sub-module.

7. A method of synthesizing a register transfer level (RTL) based design of a system comprising the steps of:
   determining sub-modules of a top level system;
   determining individual time budgets for each sub-module based on timing requirements of the top-level system;
   synthesizing a gate level design of said each sub-module based on the determined time budgets for said each sub-module;
   generating a netlist for the gate level design of said each sub-module;
   integrating the netlist of said each sub-module to form an integrated top level design netlist;
   testing the integrated top-level design netlist for conformance with top-level design requirements;
   generating a top-level netlist when the integrated top-level design netlist conforms to the top-level design requirements; and
   testing the gate level design of said each sub-module for conformance with design requirements of said each sub-module prior to integrating the netlists to form the integrated top-level design netlist, wherein
   testing the gate level design of said each sub-module includes performing static timing analysis on said each sub-module for conformance with timing requirements for said each sub-module, and
   the netlist for the gate level design of said each sub-module is generated only if the timing requirements for said each sub-module are met.

8. The method of claim 7, wherein the step of synthesizing is re-performed and the gate level design is re-tested in an iterative manner for verifying conformance of the gate level design with the timing requirements of said each sub-module.

9. The method of claim 8, wherein the step of synthesizing a gate level design is further based on wire loads and input/output loads/drivers.

10. The method of claim 9, wherein the step of testing the gate level design of said each sub-module for conformance with design requirements includes performing a dynamic simulation on the gate level design of said each sub-module.

* * * * *